US012715311B2

(12) United States Patent
Koshimae

(10) Patent No.: US 12,715,311 B2
(45) Date of Patent: Aug. 25, 2026

(54) MOBILE BODY AND BATTERY REMAINING AMOUNT NOTIFICATION METHOD

(71) Applicant: Sony Group Corporation, Tokyo (JP)

(72) Inventor: Hidenari Koshimae, Tokyo (JP)

(73) Assignee: Sony Group Corporation, Tokyo (JP)

( * ) Notice: Subject to any disclaimer, the term of this patent is extended or adjusted under 35 U.S.C. 154(b) by 145 days.

(21) Appl. No.: 18/565,546

(22) PCT Filed: Feb. 8, 2022

(86) PCT No.: PCT/JP2022/004792

§ 371 (c)(1),
(2) Date: Nov. 30, 2023

(87) PCT Pub. No.: WO2022/259613

PCT Pub. Date: Dec. 15, 2022

(65) Prior Publication Data

US 2024/0367546 A1 Nov. 7, 2024

(30) Foreign Application Priority Data

Jun. 9, 2021 (JP) ................................ 2021-096305

(51) Int. Cl.
*B60L 58/10* (2019.01)
*B60L 50/60* (2019.01)
(Continued)

(52) U.S. Cl.
CPC ............... *B60L 50/60* (2019.02); *B60L 58/10* (2019.02); *B64U 50/30* (2023.01); *G01R 31/3835* (2019.01); *H01M 10/425* (2013.01); *H01M 10/482* (2013.01); *H01M 50/204* (2021.01); *H01M 50/249* (2021.01);
(Continued)

(58) Field of Classification Search
CPC ......... B60L 50/60; B60L 58/10; B64U 50/30; G01R 31/3835; H01M 10/425
See application file for complete search history.

(56) References Cited

U.S. PATENT DOCUMENTS

2016/0109931 A1* 4/2016 Kobayashi ........... G02B 27/017
345/212
2018/0118374 A1* 5/2018 Lombardini .............. B64F 3/02

FOREIGN PATENT DOCUMENTS

CN 110843606 A * 2/2020 ............. B60L 58/22
JP 2006017595 A * 1/2006
(Continued)

OTHER PUBLICATIONS

International Search Report and Written Opinion mailed on Mar. 22, 2022, received for PCT Application PCT/JP2022/004792, filed on Feb. 8, 2022, 8 pages including English Translation.

*Primary Examiner* — Scott A Browne
*Assistant Examiner* — Jason Nguyen
(74) *Attorney, Agent, or Firm* — XSENSUS LLP

(57) ABSTRACT

A mobile body is capable of easily confirming a remaining amount of a battery of the mobile body and a battery remaining amount notification method. The mobile body includes: an attachment portion to which two or more batteries are capable of being attached; and an output unit configured to provide notification of a remaining amount of each of the batteries in a case where the number of attached batteries changes. The mobile body can be applied to, for example, a drone.

13 Claims, 11 Drawing Sheets

(51) Int. Cl.

| | |
|---|---|
| ***B64U 50/30*** | (2023.01) |
| ***G01R 31/3835*** | (2019.01) |
| ***H01M 10/42*** | (2006.01) |
| ***H01M 10/48*** | (2006.01) |
| ***H01M 50/204*** | (2021.01) |
| ***H01M 50/249*** | (2021.01) |
| ***H01M 50/269*** | (2021.01) |

(52) U.S. Cl.
CPC ....... *H01M 50/269* (2021.01); *B60L 2200/10* (2013.01); *H01M 2010/4271* (2013.01); *H01M 2220/20* (2013.01)

(56) References Cited

FOREIGN PATENT DOCUMENTS

| | | | | | |
|---|---|---|---|---|---|
| JP | 2016037108 | A | * | 3/2016 | |
| JP | 2017-010185 | A | | 1/2017 | |
| JP | 2019-045724 | A | | 3/2019 | |
| JP | 2019198137 | A | * | 11/2019 | ............... G09G 5/37 |
| KR | 20160068591 | A | * | 6/2016 | ............ H02J 7/0013 |

* cited by examiner

FIG. 1

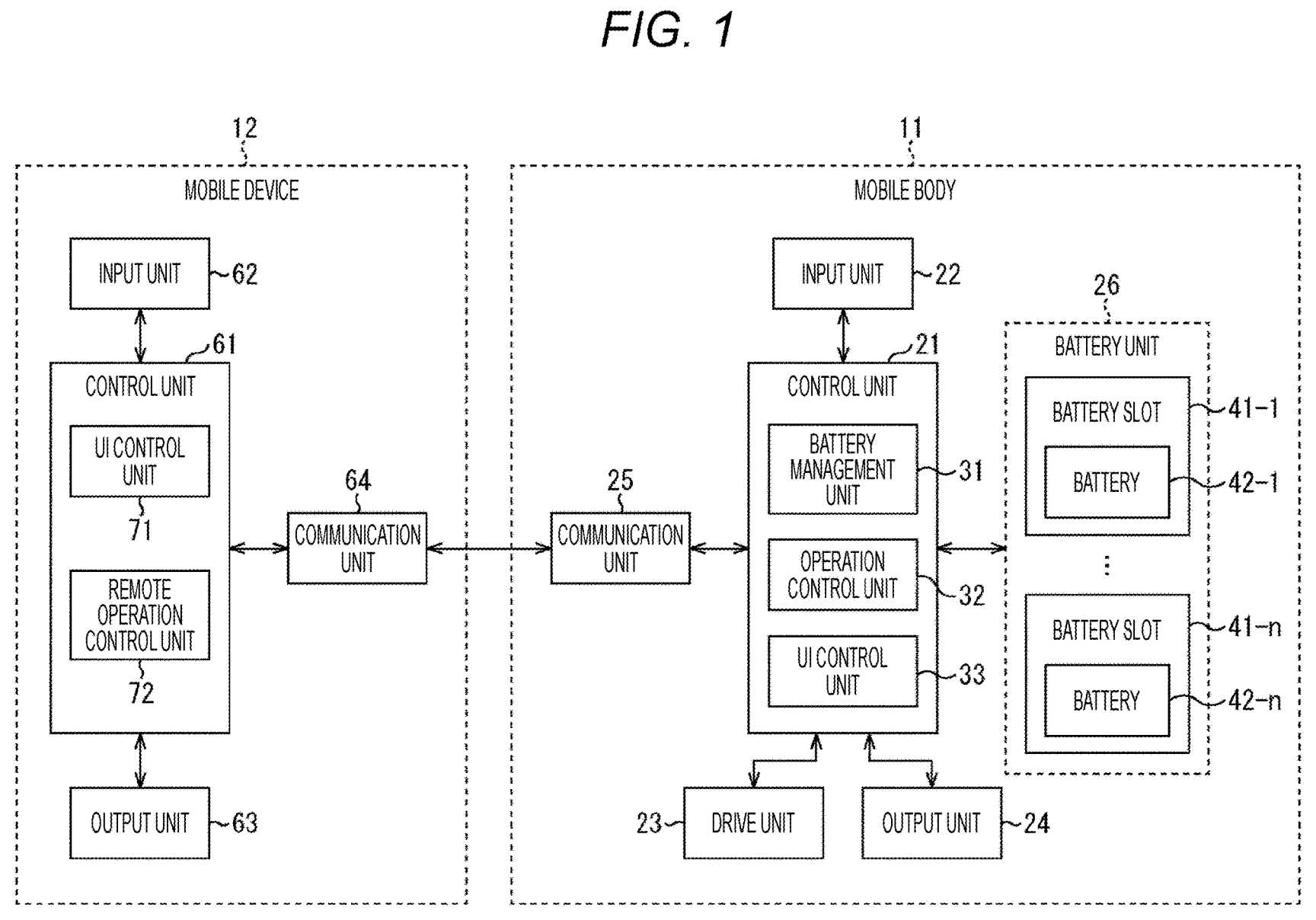

11 MOBILE BODY
21 CONTROL UNIT
22 INPUT UNIT
31 BATTERY MANAGEMENT UNIT
32 OPERATION CONTROL UNIT
33 UI CONTROL UNIT
24 OUTPUT UNIT
23 DRIVE UNIT
25 COMMUNICATION UNIT
26 BATTERY UNIT
41-1 BATTERY SLOT
42-1 BATTERY
41-n BATTERY SLOT
42-n BATTERY

12 MOBILE DEVICE
61 CONTROL UNIT
62 INPUT UNIT
63 OUTPUT UNIT
64 COMMUNICATION UNIT
71 UI CONTROL UNIT
72 REMOTE OPERATION CONTROL UNIT

FIG. 4

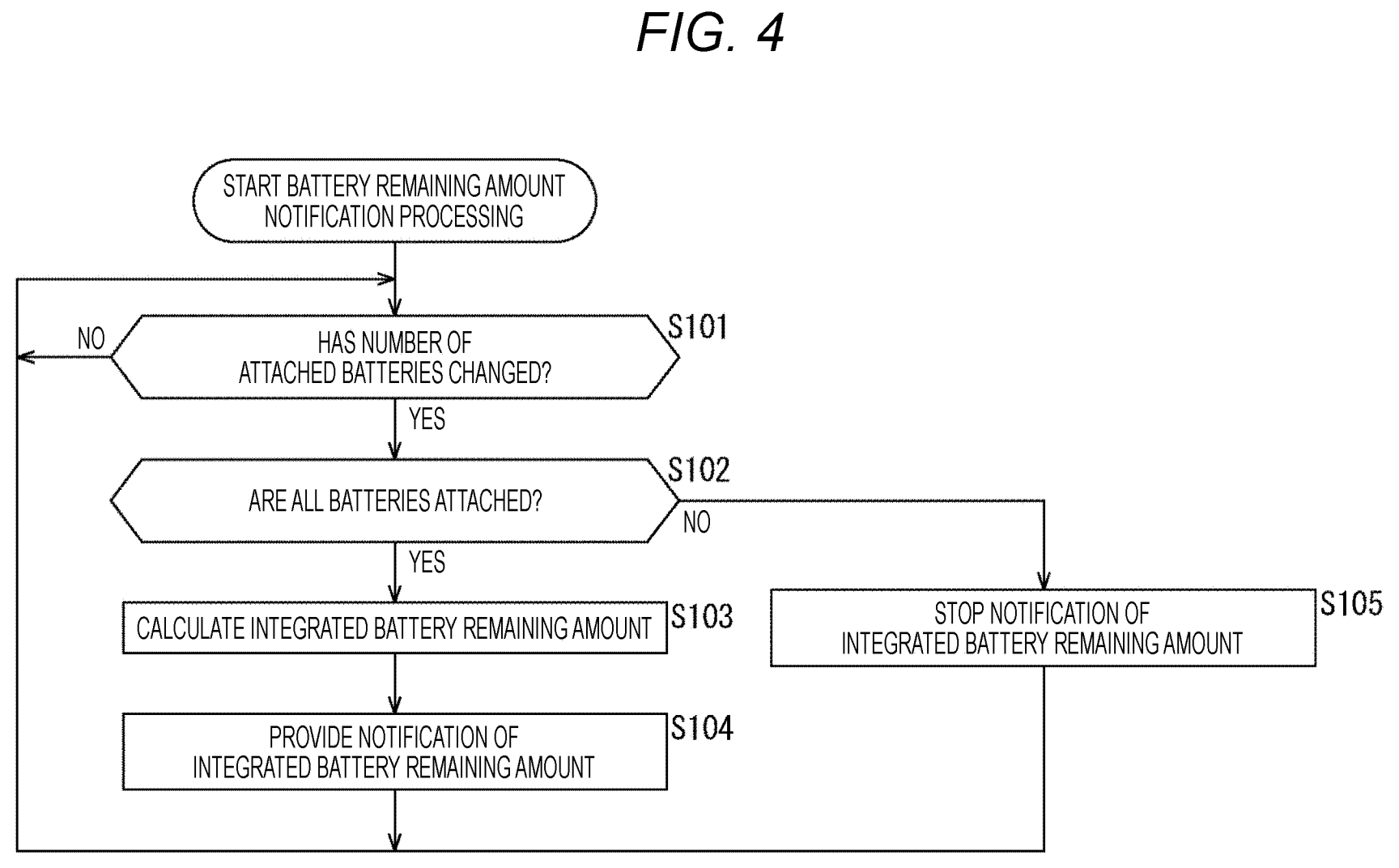

START BATTERY REMAINING AMOUNT NOTIFICATION PROCESSING

S101
HAS NUMBER OF ATTACHED BATTERIES CHANGED?

NO

YES

S102
ARE ALL BATTERIES ATTACHED?

NO

YES

S103
CALCULATE INTEGRATED BATTERY REMAINING AMOUNT

S104
PROVIDE NOTIFICATION OF INTEGRATED BATTERY REMAINING AMOUNT

S105
STOP NOTIFICATION OF INTEGRATED BATTERY REMAINING AMOUNT

FIG. 5

| LED DISPLAY | INTEGRATED BATTERY REMAINING AMOUNT |
|---|---|
| ◌ ● ● ● | $0\% \leqq bat \leqq 5\%$ |
| ○ ● ● ● | $5\% < bat \leqq 25\%$ |
| ○ ○ ● ● | $25\% < bat \leqq 50\%$ |
| ○ ○ ○ ● | $50\% < bat \leqq 75\%$ |
| ○ ○ ○ ○ | $75\% < bat \leqq 100\%$ |

MOBILE BODY AND BATTERY REMAINING AMOUNT NOTIFICATION METHOD

CROSS-REFERENCE TO RELATED APPLICATIONS

The present application is based on PCT filing PCT/JP2022/004792, filed Feb. 8, 2022, which claims priority from Japanese Patent Application No. 2021-096305, filed Jun. 9, 2021, the entire contents of each are incorporated herein by reference.

TECHNICAL FIELD

The present technology relates to a mobile body and a battery remaining amount notification method, and more particularly, to a mobile body suitable for use in notification of a remaining amount of a battery of a mobile body and a battery remaining amount notification method.

BACKGROUND ART

In the related art, it has been proposed to provide notification of the battery remaining amount of a drone by using a color of a light emitting diode (LED), and lighting or blinking the LED (for example, refer to Patent Document 1).

CITATION LIST

Patent Document

Patent Document 1: Japanese Patent Application Laid-Open No. 2019-45724

SUMMARY OF THE INVENTION

Problems to be Solved by the Invention

However, in the invention described in Patent Document 1, it is necessary to turn on the power of a machine body in order to confirm the remaining amount of the battery. Furthermore, it takes a certain amount of time for the machine body to be activated and for the remaining amount of the battery to be capable of being confirmed.

The present technology has been made in view of such a situation, and is intended to make it possible to easily and quickly confirm the remaining amount of the battery of the mobile body such as a drone.

Solutions to Problems

According to an aspect of the present technology, there is provided a mobile body including: an attachment portion to which two or more n batteries are capable of being attached; and an output unit configured to provide notification of a remaining amount of each of the batteries in a case where the number of attached batteries changes.

According to another aspect of the present technology, there is provided a battery remaining amount notification method including causing a mobile body to which two or more n batteries are capable of being attached to provide notification of a remaining amount of each of the batteries in a case where the number of attached batteries changes.

In the aspects of the present technology, notification of the remaining amount of the battery is provided in a case where the number of attached batteries changes.

BRIEF DESCRIPTION OF DRAWINGS

FIG. 1 is a block diagram illustrating a configuration example of a mobile body and a mobile device to which the present technology is applied.

FIG. 4 is a flowchart for explaining battery remaining amount notification processing executed by the drone illustrated in FIG. 3.

FIG. 5 is a diagram illustrating a display example of a power supply status LED.

FIG. 6 is a diagram illustrating an example of a display screen of a mobile device.

FIG. 8 is a diagram illustrating a display example of a battery remaining amount display region.

MODE FOR CARRYING OUT THE INVENTION

Modes for carrying out the present technology will be described below. The description will be given in the following order.

1. Embodiment
2. Specific example
3. Modification example
4. Others

1. Embodiment

Figure 2:
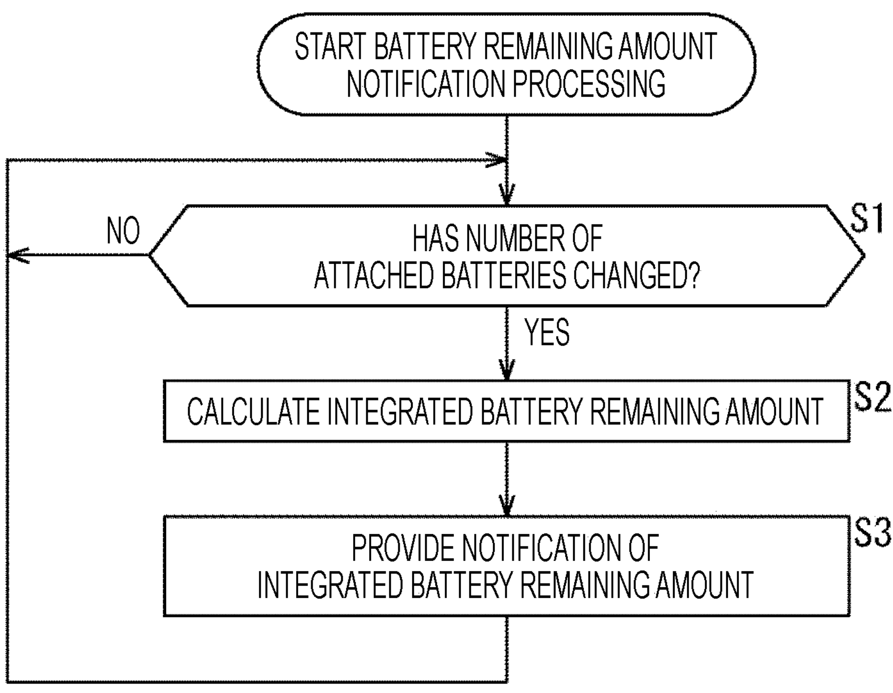
FIG. 2 is a flowchart for explaining battery remaining amount notification processing executed by the mobile body illustrated in FIG. 1.

First, an embodiment of the present technology will be described with reference to FIG. 1 and FIG. 2.

<Configuration Example of Mobile Body 11 and Mobile Device 12>

FIG. 1 illustrates a configuration example of a function of a part mainly related to processing of providing notification of the remaining amount of a battery among configurations of a mobile body 11 and a mobile device 12 to which the present technology is applied.

The mobile body 11 is configured by, for example, a mobile body driven by a battery, such as a drone and a robot.

The mobile device 12 is configured by a smartphone, a tablet terminal, a personal computer (PC), a remote controller, and the like. The mobile device 12 is used, for example, for outputting information transmitted from the mobile body 11, performing a remote operation of the mobile body 11, and the like.

The mobile body 11 includes a control unit 21, an input unit 22, a drive unit 23, an output unit 24, a communication unit 25, and a battery unit 26.

The control unit 21 controls each unit of the mobile body 11. The control unit 21 includes a battery management unit 31, an operation control unit 32, and a user interface (UI) control unit 33.

The battery management unit 31 manages batteries 42-1 to **42-*n* which are attached to battery slots 41-1 to 41-*n* of the battery unit 26. For example, the battery management unit 31 detects the states (for example, a voltage, a remaining amount, and the like) of the batteries 42-1 to 42**-*n*, and controls the outputs of currents from the batteries 42-1 to 42-*n*.

The operation control unit 32 controls the movement and various operations of the mobile body 11 by controlling the drive unit 23 and the like.

The UI control unit 33 controls user interfaces in the mobile body 11 and the mobile device 12. For example, the UI control unit 33 controls input of various commands, data, and the like by the input unit 22. For example, the UI control unit 33 controls output of various types of information by the output unit 24. For example, the UI control unit 33 generates information regarding the mobile body 11 to be output to the mobile device 12, and transmits the information to the mobile device 12 via the communication unit 25.

The input unit 22 includes various input devices, and supplies the input command, data, and the like to the control unit 21. As the input devices included in the input unit 22, for example, a touch panel, a button, a switch, a lever, and the like are assumed.

The drive unit 23 includes, for example, a prime mover (for example, a motor, an engine, or the like), and a drive mechanism, and moves the mobile body 11 by using the electric power of the batteries 42-1 to 42-*n* under the control of the operation control unit 32.

The output unit 24 includes various output devices and outputs various types of information regarding the mobile body 11. As the output devices included in the output unit 24, for example, a display device such as a liquid crystal display (LCD), a light emitting device such as an LED, and a sound output device such as a speaker, a siren, and an alarm are assumed. As various types of information regarding the mobile body 11, for example, information indicating a state of the mobile body 11, information for operating the mobile body 11, and the like are assumed.

The communication unit 25 communicates with the mobile device 12 by wireless communication. A communication method of the communication unit 25 is not particularly limited, and any wireless communication method is applied.

The battery unit 26 includes the battery slots 41-1 to 41-*n* (n≥2). The batteries 42-1 to 42-*n* are respectively attached to the battery slots 41-1 to 41-*n*. That is, the battery unit 26 includes an attachment portions to which n batteries can be attached.

Note that, hereinafter, in a case where it is not necessary to individually distinguish the battery slots 41-1 to 41-*n*, these are simply referred to as a battery slot 41. In a case where it is not necessary to individually distinguish the batteries 42-1 to 42-*n*, these are simply referred to as a battery 42.

The battery unit 26 supplies the current of each battery 42 to each unit of the mobile body 11 such as the prime mover included in the drive unit 23 under the control of the battery management unit 31.

The battery unit 26 supplies battery information indicating the state of the battery 42 to the control unit 21. The battery information includes, for example, whether or not the battery 42 is attached to each battery slot 41, and a remaining amount and voltage of each battery 42.

In a case where the attachment state of the battery 42 changes, the battery unit 26 notifies the control unit 21 of the change in the attachment state of the battery 42. As a change in the attachment state of the battery 42, for example, attachment of the battery 42 to the battery slot 41 and detachment of the battery 42 from the battery slot 41 are assumed.

The mobile device 12 includes a control unit 61, an input unit 62, an output unit 63, and a communication unit 64.

The control unit 61 controls each unit of the mobile device 12. The control unit 61 includes a UI control unit 71 and a remote operation control unit 72.

The UI control unit 71 controls a user interface in the mobile device 12. For example, the UI control unit 71 controls input of various commands, data, and the like by the input unit 62. For example, the UI control unit 71 controls output of various types of information by the output unit 63.

The remote operation control unit 72 controls a remote operation of the mobile body 11 using the mobile device 12. For example, the remote operation control unit 72 transmits a command for the mobile body 11 input using the input unit 22 to the mobile body 11 via the communication unit 64.

The input unit 62 includes various input devices, and supplies the input command, data, and the like to the control unit 61. As the input devices included in the input unit 62, for example, a touch panel, a button, a switch, a lever, and the like are assumed.

The output unit 63 includes various output devices and outputs various types of information. As the output devices included in the output unit 63, for example, a display device such as an LCD, a light emitting device such as an LED, and a sound output device such as a speaker, a siren, and an alarm are assumed.

The communication unit 64 communicates with the mobile body 11 by wireless communication in the same manner as the communication unit 25 of the mobile body 11.

<Battery Remaining Amount Notification Processing>

Next, battery remaining amount notification processing executed by the mobile body 11 will be described with reference to FIG. 2.

This processing is executed, for example, in a case where the power of the mobile body 11 is turned off.

In step S1, the battery management unit 31 determines whether or not the number of attached batteries 42 has changed. This processing is repeatedly executed until it is determined that the number of attached batteries 42 has changed.

For example, in a case where attachment of the battery 42 to the battery slot 41 is detected or detachment of the battery 42 from the battery slot 41 is detected, the battery unit 26 notifies the control unit 21 of a change in the attachment state of the battery 42.

On the other hand, the battery management unit 31 determines that the number of the attached batteries 42 has changed, and the processing proceeds to step S2.

In step S2, the battery management unit 31 calculates an integrated battery remaining amount. Specifically, the battery management unit 31 acquires battery information from the battery unit 26, and calculates the integrated battery remaining amount on the basis of the battery information. For example, the battery management unit 31 calculates the maximum value, minimum value, or average value of the remaining amount of each battery 42 attached to the battery slot 41 as the integrated battery remaining amount.

In step S3, the mobile body 11 provides notification of the integrated battery remaining amount on the basis of the calculation result of the integrated battery remaining amount. For example, the output unit 24 provides notification of the integrated battery remaining amount only for a predetermined period of time (for example, for 10 seconds) by at least one of a visual method or an auditory method under the control of the UI control unit 33. That is, after the number of attached batteries 42 changes, notification of the integrated battery remaining amount is provided for a predetermined period of time.

Furthermore, for example, the UI control unit 33 transmits information indicating the integrated battery remaining amount to the mobile device 12 via the communication unit 25.

On the other hand, the UI control unit 71 of the mobile device 12 receives the information indicating the integrated battery remaining amount from the mobile body 11 via the communication unit 64. The output unit 63 provides notification of the integrated battery remaining amount only for a predetermined period of time (for example, for 10 seconds) by at least one of a visual method or an auditory method under the control of the UI control unit 33.

Note that a method of providing notification of the integrated battery remaining amount in the mobile body 11 and the mobile device 12 is not particularly limited. For example, notification of the integrated battery remaining amount is provided by lighting or blinking a lamp such as an LED. For example, notification of the integrated battery remaining amount is provided through a screen with a graphical user interface (GUI). For example, notification of the integrated battery remaining amount is provided by sound.

Thereafter, the processing returns to step S1, and the processing in and after step S1 is executed.

As described above, notification of the integrated battery remaining amount of the mobile body 11 is provided only by attaching the battery 42 to the mobile body 11 or detaching the battery 42 from the mobile body 11. Therefore, a user can easily and quickly confirm the integrated battery remaining amount without turning on the power of the mobile body 11 or performing a special operation. Furthermore, it is not necessary to mount a special button or the like for confirming the integrated battery remaining amount on the mobile body 11. Moreover, since it is assumed that the user often wants to know the remaining amount of the battery 42 immediately after attaching the battery 42, notification of the integrated battery remaining amount is provided at an appropriate timing.

Note that, in a case where the power of the mobile body 11 is turned on, for example, notification of the integrated battery remaining amount is constantly provided regardless of the presence or absence of a change in the number of attached batteries 42.

2. Specific Example

Figure 10:
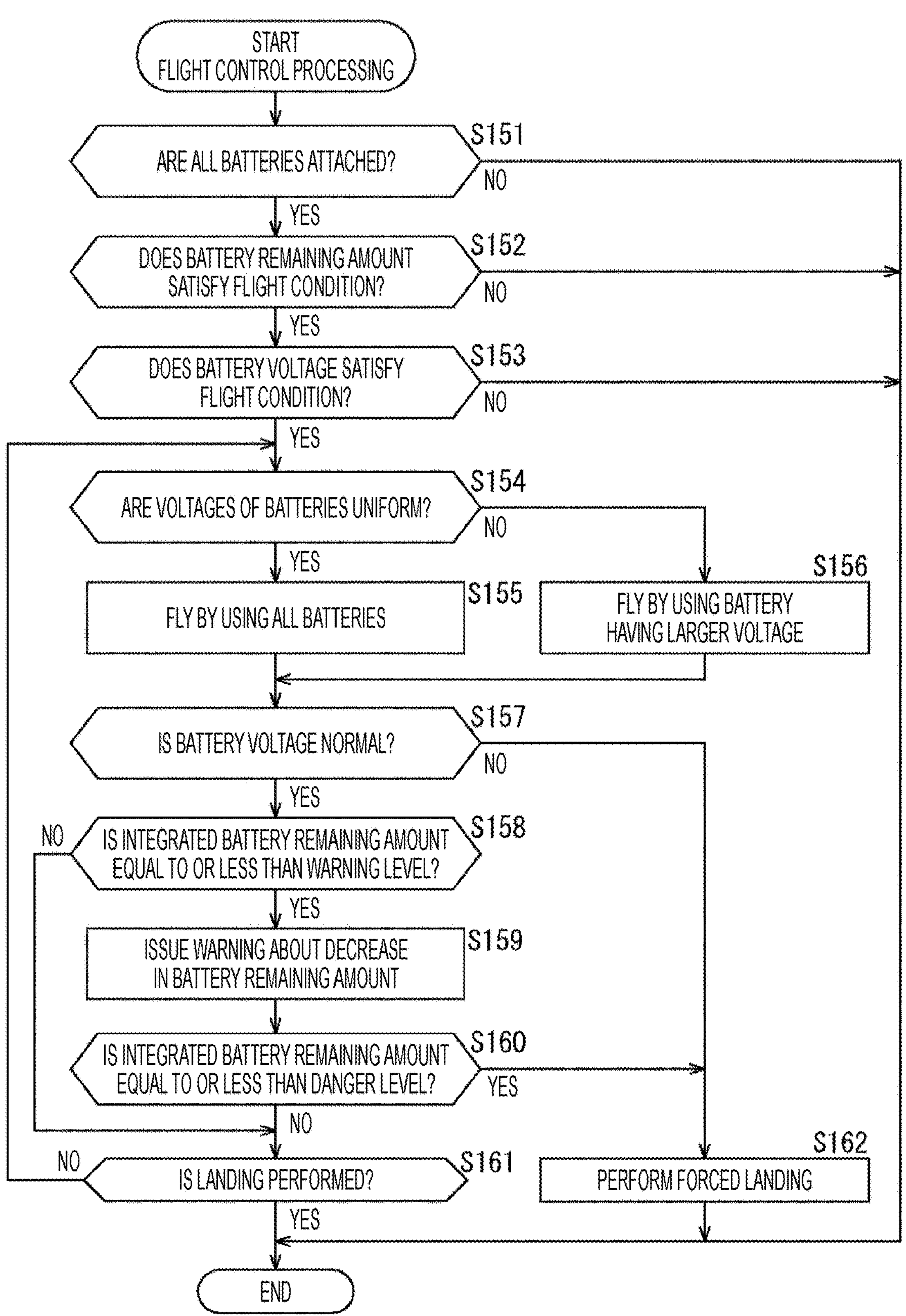
FIG. 10 is a flowchart for explaining flight control processing executed by the drone illustrated in FIG. 3.

Next, a specific example of the embodiment of the present technology will be described with reference to FIG. 1 and FIG. 2, and with reference to FIG. 3 and FIG. 10.

Figure 3:
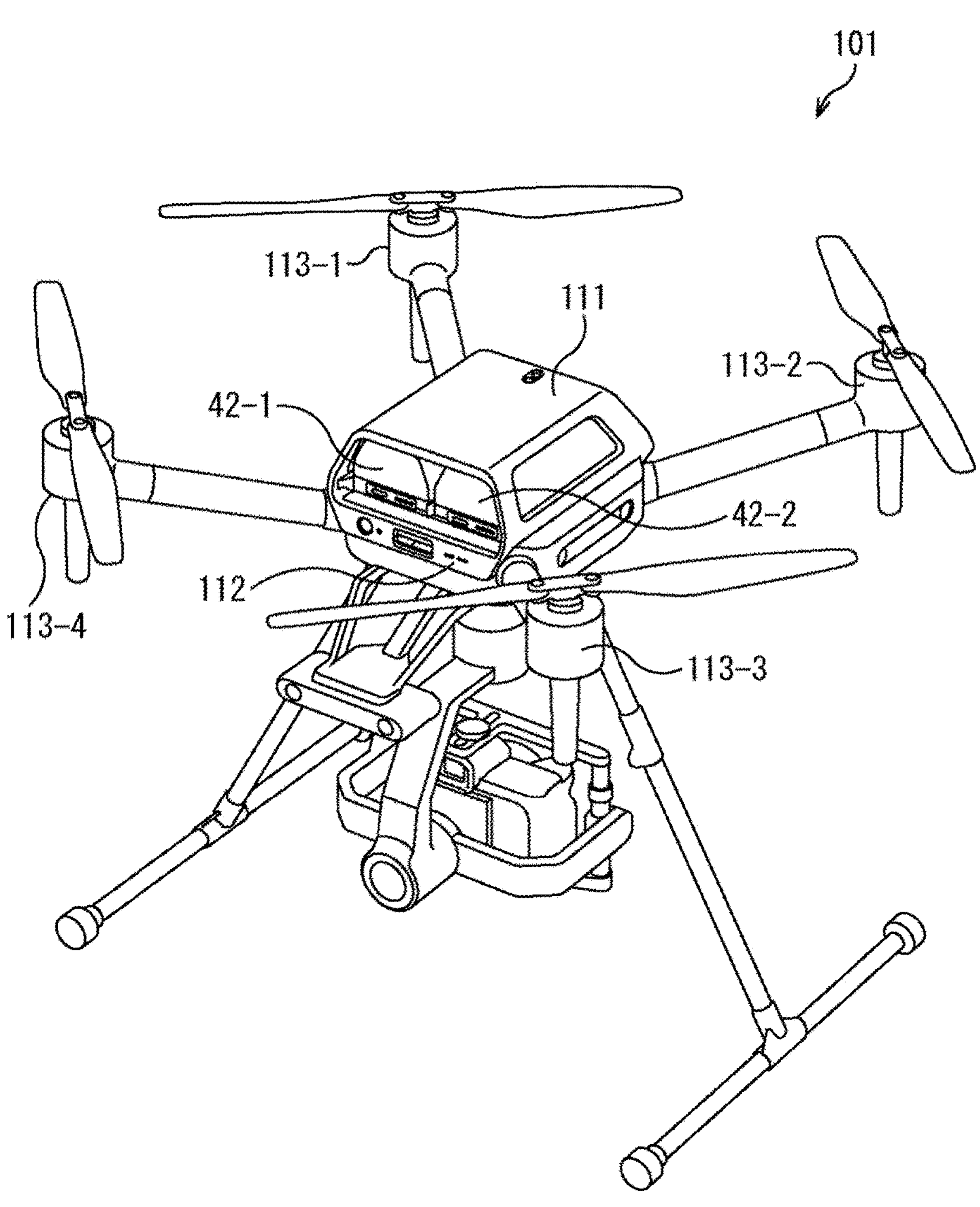
FIG. 3 is an external view illustrating a configuration example of a drone to which the present technology is applied.

In this specific example, an example in a case where a drone 101 of FIG. 3 is used as the mobile body 11 of FIG. 1 is described.

Note that a configuration example of the function of the drone 101 is similar to the configuration example of the function of the mobile body 11 in FIG. 1.

However, it is assumed that the drone 101 includes two battery slots 41 of a battery slot 41-1 and a battery slot 41-2, and is capable of having the maximum two batteries 42 mounted.

Furthermore, it is assumed that the drone 101 cannot start a flight unless the batteries 42 are attached to all the battery slots 41. For example, even when an abnormality occurs in one battery 42 during the flight, the drone can continue to fly with the remaining batteries 42 without falling.

FIG. 3 illustrates a configuration example of an external view of the drone 101 as viewed from the back.

On the back surface of a main body 111 of the drone 101, a battery remaining amount LED 112 is provided.

As will be described later with reference to FIG. 5, the battery remaining amount LED 112 displays the integrated battery remaining amount of the battery 42 attached to the battery slot 41.

Furthermore, flight status LEDs 113-1 to 113-4 are provided in the vicinity of propellers, respectively. The flight status LEDs 113-1 to 113-4 are LEDs indicating a flight state of the drone 101. For example, the flight status LEDs 113-1 to 113-4 blink in a case where the remaining amount of the battery 42 is low.

Note that, hereinafter, in a case where it is not necessary to individually distinguish the flight status LEDs 113-1 to 113-4, these are simply referred to as a flight status LED 113.

Furthermore, for example, a button and an LED are provided on the back surface of each battery 42 (the surface on the back surface side of the main body 111 of the drone 101). Then, when the button of each battery 42 is pressed, the remaining amount of each battery 42 is individually displayed by the LED.

<Battery Remaining Amount Notification Processing>

Next, battery remaining amount notification processing executed by the drone 101 will be described with reference to a flowchart of FIG. 4.

This processing is executed, for example, in a case where the power of the drone 101 is turned off.

In step S101, similarly to the processing in step S1 of FIG. 1, it is determined whether or not the number of attached batteries 42 has changed. This processing is repeatedly executed until it is determined that the number of attached batteries 42 has changed. In a case where it is determined that the number of attached batteries 42 has changed, the processing proceeds to step S102.

In step S102, the battery management unit 31 determines whether or not all the batteries 42 are attached. In a case where the batteries 42 are attached to all the battery slots 41, the battery management unit 31 determines that all the batteries 42 are attached, and the processing proceeds to step S103.

In step S103, similarly to the processing in step S2 of FIG. 1, the integrated battery remaining amount is calculated. Note that, hereinafter, it is assumed that the smaller remaining amount of the remaining amount of the battery 42-1 and the remaining amount of the battery 42-2 is processed as the integrated battery remaining amount.

In step S104, similarly to the processing of step S3 of FIG. 1, notification of the integrated battery remaining amount is provided.

Here, a specific example of a method of providing notification of the integrated battery remaining amount will be described with reference to FIG. 5. FIG. 5 illustrates a display example of the battery remaining amount LED 112.

In this example, an example is described in which the battery remaining amount LED 112 displays the integrated battery remaining amount by four LEDs. Note that, hereinafter, the leftmost LED is referred to as a first LED, the second LED from the left is referred to as a second LED, the third LED from the left is referred to as a third LED, and the rightmost LED is referred to as a fourth LED.

A white circle of the LED display in FIG. 5 indicates a state in which the LED is lit or blinks. A black circle of the LED display indicates a state in which the LED is turned off.

bat in a conditional expression in FIG. 5 indicates the integrated battery remaining amount.

For example, when 0%≤integrated battery remaining amount≤5%, the first LED blinks at a high speed, and the second to fourth LEDs are turned off.

For example, when 5%<integrated battery remaining amount≤25%, the first LED is lit, and the second to fourth LEDs are turned off.

For example, when 25%<integrated battery remaining amount≤50%, the first LED and the second LED are lit, and the third and fourth LEDs are turned off.

For example, when 50%<integrated battery remaining amount≤75%, the first to third LEDs are lit, and the fourth LED is turned off.

For example, when 75%<integrated battery remaining amount≤100%, the first to fourth LEDs are lit.

Thereafter, the processing returns to step S101, and the processing in and after step S101 are executed.

On the other hand, in step S102, in a case where there is at least one battery slot 41 to which the battery 42 is not attached, the battery management unit 31 determines that at least some of the batteries 42 are not attached, and the processing proceeds to step S105.

In step S105, the mobile body 11 stops the notification of the integrated battery remaining amount. For example, in a case where notification of the integrated battery remaining amount is being provided, the output unit 24 stops the notification of the integrated battery remaining amount under the control of the UI control unit 33. As a result, for example, the battery remaining amount LED 112 is turned off.

Note that, in a case where notification of the integrated battery remaining amount is not provided, the state in which notification of the integrated battery remaining amount is not provided is continued.

Thereafter, the processing returns to step S101, and the processing in and after step S101 are executed.

As described above, the user can confirm the battery remaining amount of the drone 101 only by attaching the batteries 42 to all the battery slots 41 without turning on the power of the drone 101.

Furthermore, when the batteries 42 are attached to all the battery slots 41 and the drone 101 is not in a state of being capable of flying, notification of the integrated battery remaining amount is not provided. Therefore, the user can easily notice that there is the battery slot 41 to which the battery 42 is not attached.

Note that, in a case where the power of the drone 101 is turned on, for example, the battery remaining amount LED 112 provides notification of the integrated battery remaining amount regardless of the presence or absence of a change in the number of attached batteries 42.

<Method of Providing Notification of State of Battery 42 in Mobile Device 12>

Next, an example of a method of providing notification of a state of the battery 42 in the mobile device 12 will be described with reference to FIGS. 6 to 9.

For example, in a case where the drone 101 is powered on and the mobile device 12 can communicate with the drone 101, the mobile device 12 periodically receives battery information from the drone 101 and provides notification of the state of the battery 42 on the basis of the received battery information.

Figure 6:
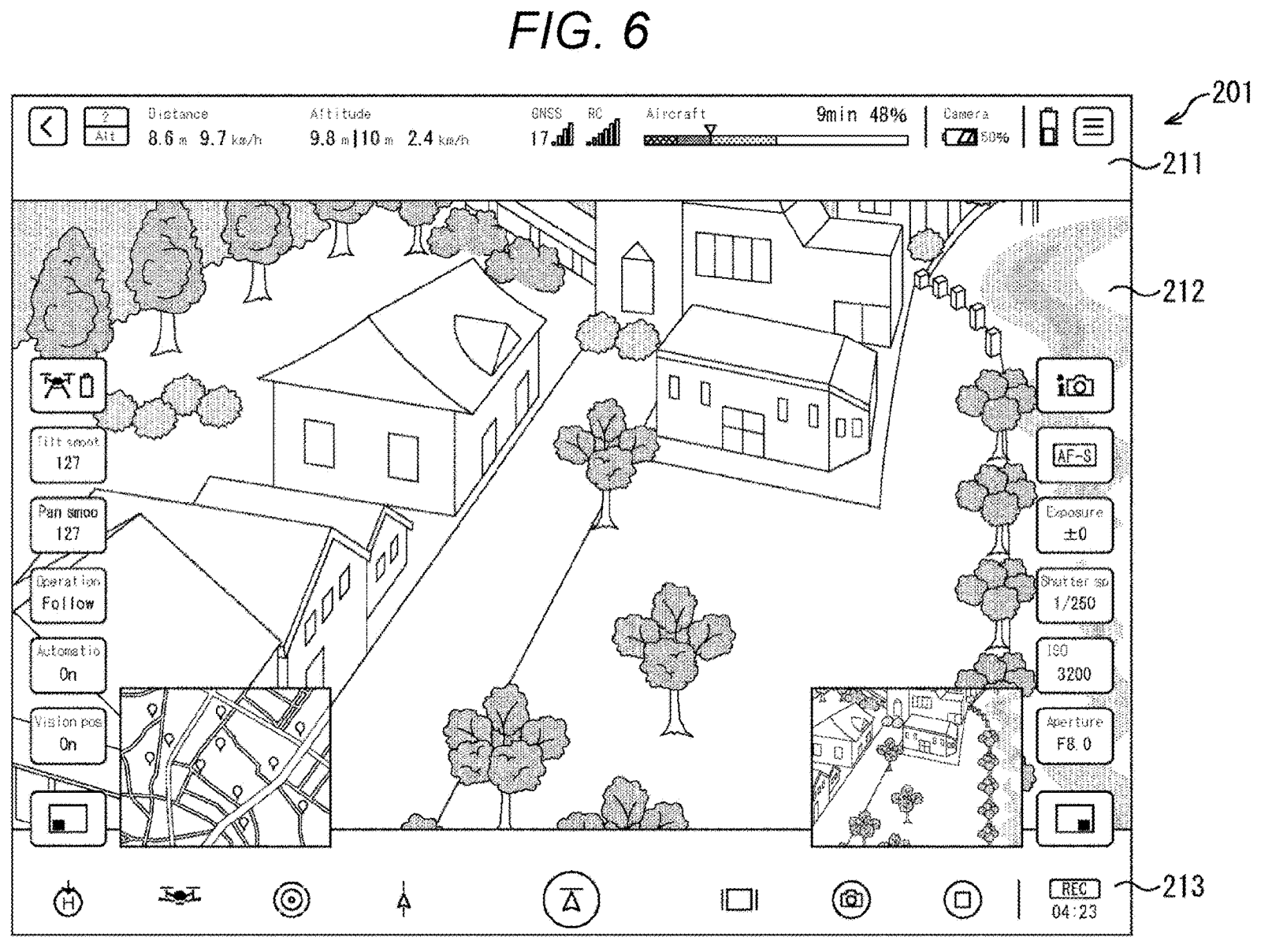

FIG. 6 illustrates an example of a display screen 201 displayed on the display device included in the output unit 24 of the mobile device 12. The display screen 201 is, for example, a screen displayed by an application for confirming the state of the drone 101 or performing a remote operation.

The display screen 201 is roughly divided into the display regions 211 to 213. The display region 211 is disposed in a band shape at the upper end of the display screen 201, and the display region 213 is disposed in a band shape at the lower end of the display screen 201. The display region 212 is disposed between the display region 211 and the display region 213.

The display region 211 is a region in which the state of the drone 101, the state of the mobile device 12, and the like are displayed. The state of the battery 42 of the drone 101 is displayed in the display region 211.

The display region 212 is a region in which an image captured by the drone 101, a map indicating the current position of the drone 101, and the like are displayed. Furthermore, in the display region 212, various icons indicating the state of the drone 101, the state of a camera mounted on the drone 101, and the like are displayed.

The display region 213 is a region in which buttons for remotely operating the drone 101, operation buttons for the display screen 201, and the like are displayed.

Next, the display example of the battery remaining amount in the display region 211 will be described with reference to FIG. 7 and FIG. 8.

Figure 7:
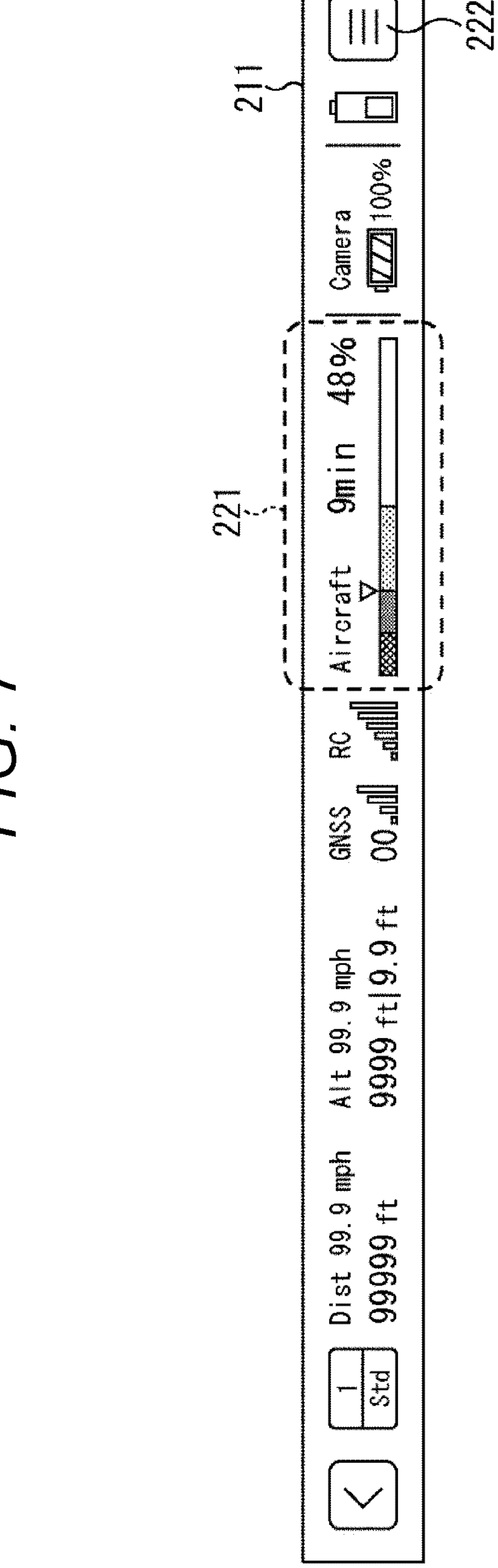
FIG. 7 is a diagram illustrating a display example of a battery remaining amount display region.

The battery remaining amount of the drone 101 is displayed in a battery remaining amount display region 221 surrounded by a dotted frame in FIG. 7. Specifically, in the battery remaining amount display region 221, a specific numerical value (48%) of the battery remaining amount, a flyable time (9 min) with the current battery remaining amount, and a battery remaining amount graph are displayed.

The flyable time is, for example, a time from the current time point until the battery remaining amount reaches a danger level and the forced landing is started.

The battery remaining amount graph is a graph showing the integrated battery remaining amount with a bar extending horizontally with 100% as a maximum value. The left end of the battery remaining amount graph is 0%, and the right end is 100%. The color of the bar is set to a different color for each range of the value of the integrated battery remaining amount. For example, the color of the bar is set to red in a range of the integrated battery remaining amount from 0% to the danger level, set to yellow in a range from the danger level to a warning level, and set to white in a range greater than the warning level.

Note that the warning level is, for example, a level at which a warning for a decrease in the battery remaining amount is started. The danger level is, for example, a level at which the drone 101 starts forced landing.

Figure 8:
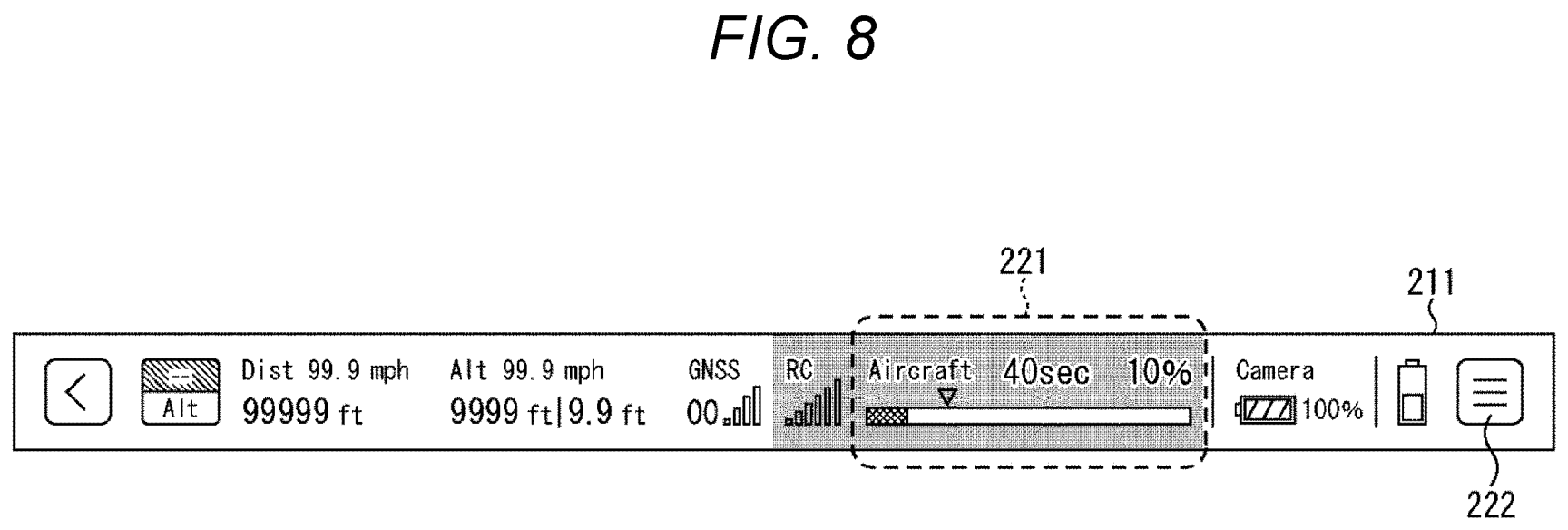

FIG. 8 illustrates a state of the display region 211 in a case where the integrated battery remaining amount becomes equal to or lower than the danger level.

In a case where the integrated battery remaining amount becomes equal to or lower than the danger level, for example, the color of the battery remaining amount display region 221 and the color of the surrounding changes to red. As a result, the user can quickly notice that the integrated battery remaining amount has become equal to or lower than the danger level.

Figure 9:
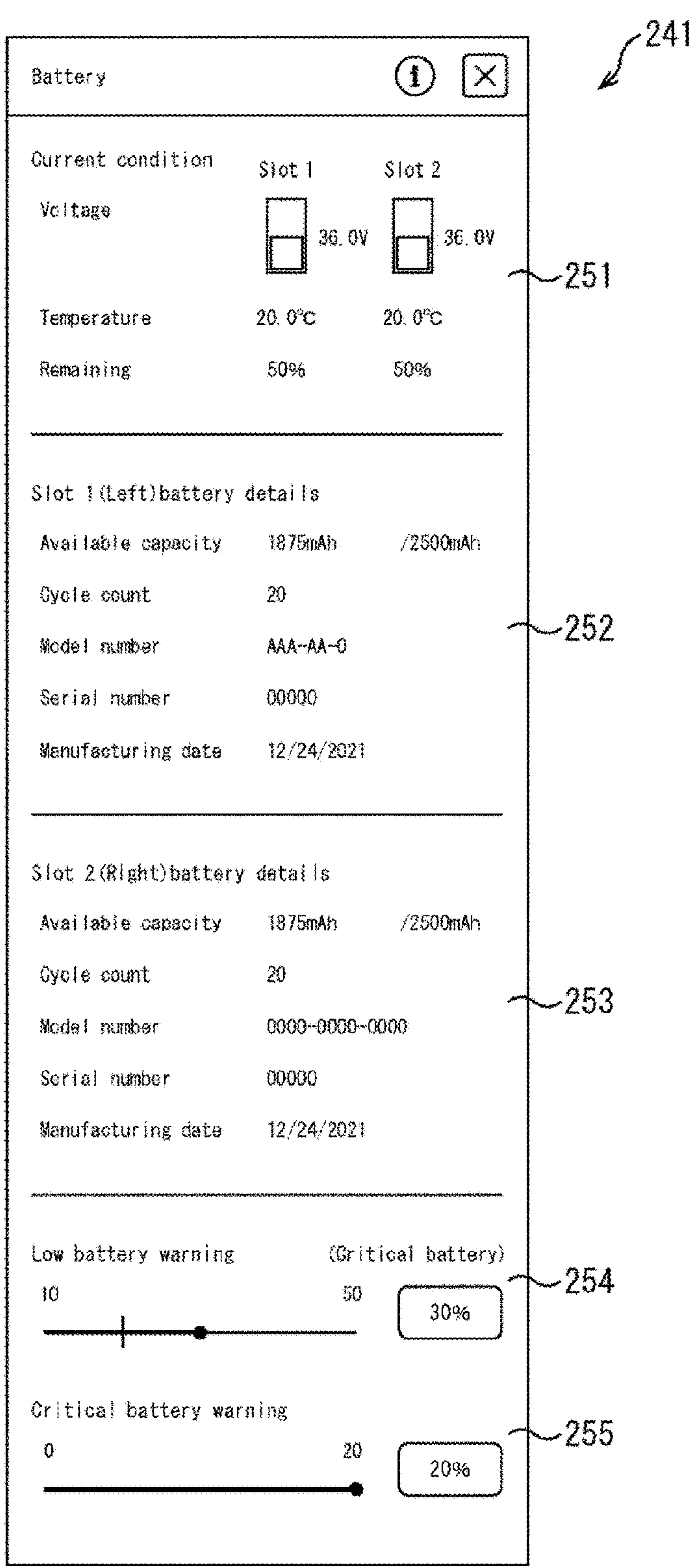
FIG. 9 is a diagram illustrating a display example of a battery management screen.

Furthermore, a battery management screen 241 of FIG. 9 is displayed by an operation such as pressing a setting button 222 at the right end of the display region 211. The battery management screen 241 is roughly divided into the display regions 251 to 255.

The state of each battery 42 is displayed in the display region 251. For example, the voltage, temperature, and remaining amount of the battery 42-1 attached to the battery slot 41-1, and the voltage, temperature, and remaining amount of the battery 42-2 attached to the battery slot 41-1 are displayed.

In the display region 252, information regarding the battery 42-1 attached to the battery slot 41-1 is displayed. For example, the current capacity, the maximum capacity, the number of times of charging, the model number, the serial number, and the manufacturing date and time of the battery 42-1 are displayed.

In the display region 253, information regarding the battery 42-2 attached to the battery slot 41-2 is displayed. For example, the current capacity, the maximum capacity, the number of times of charging, the model number, the serial number, and the manufacturing date and time of the battery 42-2 are displayed.

A warning level setting screen is displayed in the display region 254. The warning level can be set, for example, in a range of 10% to 50% of the integrated battery remaining amount.

A danger level setting screen is displayed in the display region 255. The danger level can be set, for example, in a range of 0% to 20% of the integrated battery remaining amount. However, the danger level cannot be set to a value greater than the warning level.

As described above, the user can confirm the state and specification of the battery 42 of the drone 101 and set the warning level and the danger level by using the mobile device 12.

<Flight Control Processing>

Next, flight control processing executed by the drone 101 will be described with reference to a flowchart in FIG. 10.

This processing is started, for example, in a case where the mobile device 12 transmits a command for instructing the drone 101 to start a flight under the operation of the user.

In step S151, the battery management unit 31 determines whether or not all the batteries 42 are attached. Specifically, the battery management unit 31 acquires battery information from the battery unit 26. In a case where the battery management unit 31 determines that all the batteries 42 are attached on the basis of the battery information, the processing proceeds to step S152.

In step S152, the battery management unit 31 determines whether or not the battery remaining amount satisfies a flight condition. For example, the battery management unit 31 calculates the integrated battery remaining amount and a remaining amount difference between the batteries 42 on the basis of the battery information. In a case where the integrated battery remaining amount is greater than a threshold TH1 and the remaining amount difference between the batteries 42 is less than a threshold TH2, the battery management unit 31 determines that the battery remaining amount satisfies the flight condition, and the processing proceeds to step S153.

Note that the threshold TH1 is set to, for example, the above-described danger level or warning level. The threshold TH2 may be a fixed value or may be changed by the user.

In step S153, the battery management unit 31 determines whether or not the battery voltage satisfies a flight condition. For example, the battery management unit 31 calculates the voltage difference between the batteries 42 on the basis of the battery information. In a case where the voltage of each battery 42 is in a normal range and the voltage difference between the batteries 42 is less than a threshold TH3, the battery management unit 31 determines that the battery voltage satisfies the flight condition, and the processing proceeds to step S154.

Note that the threshold TH3 may be a fixed value or may be changed by the user.

In step S154, the battery management unit 31 determines whether or not the voltages of the batteries 42 are uniform. Specifically, the battery management unit 31 acquires battery information from the battery unit 26. The battery management unit 31 calculates the voltage difference between the batteries 42 on the basis of the acquired battery information. In a case where the voltage difference between the batteries 42 is less than a threshold TH4, the battery management unit 31 determines that the voltages of the batteries 42 are uniform, and the processing proceeds to step S155.

Note that the threshold TH4 is set to a value smaller than the threshold TH3 used in the processing of step S153.

In step S155, the drone 101 flies by using all the batteries 42. Specifically, the battery unit 26 supplies currents from both the battery 42-1 and the battery 42-2 to the drive unit 23 under the control of the battery management unit 31. As a result, the drive unit 23 is driven by the currents from both the battery 42-1 and the battery 42-2. The operation control unit 32 controls the drive unit 23 to cause the drone 101 to fly.

Thereafter, the processing proceeds to step S157.

On the other hand, in step S154, in a case where the voltage difference between the batteries 42 is equal to or greater than the threshold TH4, the battery management unit 31 determines that the voltages of the batteries 42 are not uniform, and the processing proceeds to step S156.

In step S156, the drone 101 flies by using the battery 42 having the larger voltage. Specifically, the battery unit 26 supplies the current from the battery 42 having the larger voltage of the battery 42-1 and the battery 42-2 to the drive unit 23 under the control of the battery management unit 31. As a result, the drive unit 23 is driven by only the current from the battery 42 having the larger voltage. The operation control unit 32 controls the drive unit 23 to cause the drone 101 to fly.

Thereafter, the processing proceeds to step S157.

In step S157, the battery management unit 31 determines whether or not the battery voltage is normal. For example, in a case where the voltages of all the batteries 42 are in the normal range, the battery management unit 31 determines that the battery voltages are normal, and the processing proceeds to step S158.

In step S158, the battery management unit 31 determines whether or not the integrated battery remaining amount is equal to or less than the warning level. Specifically, the battery management unit 31 calculates the integrated battery remaining amount on the basis of the battery information. In a case battery management unit 31 determines that the integrated battery remaining amount is equal to or less than the warning level, the processing proceeds to step S159.

In step S159, the drone 101 issues a warning about a decrease in battery remaining amount. For example, the UI control unit 33 causes the flight status LED 113 to blink in red. Furthermore, the UI control unit 33 causes the output unit 24 to output a warning sound.

In step S160, the battery management unit 31 determines whether or not the integrated battery remaining amount is equal to or less than the danger level. In a case where it is determined that the integrated battery remaining amount is equal to or greater than the danger level, the processing proceeds to step S161.

On the other hand, in a case where it is determined in step S158 that the integrated battery remaining amount is greater than the warning level, the processing in step S159 and step S160 are skipped, and the processing proceeds to step S161.

In step S161, the operation control unit 32 determines whether or not the drone has landed. In a case where it is determined that the drone has not landed, the processing returns to step S154.

Thereafter, the processing of steps S154 to S161 are repeatedly executed until it is determined in step S157 that the battery voltage is abnormal, it is determined in step S160 that the integrated battery remaining amount is equal to or less than the danger level, or it is determined in step S161 that the drone has landed.

On the other hand, in a case where it is determined in step S161 that the drone has landed, the flight control processing ends.

In a case where it is determined in step S160 that the integrated battery remaining amount is equal to or less than the danger level, the processing proceeds to step S162.

In step S157, for example, in a case where the voltage of at least one battery 42 is out of the normal range, the battery management unit 31 determines that the battery voltage is abnormal, and the processing proceeds to step S162.

In step S162, the drone 101 is forced to land. That is, the operation control unit 32 controls the drive unit 23 to force the drone 101 to land.

Thereafter, the flight control processing ends.

On the other hand, in step S153, in a case where the voltage of at least one battery 42 is out of a normal range or in a case where the voltage difference between the batteries 42 is equal to or greater than the threshold TH3, the battery management unit 31 determines that the battery voltage does not satisfy the flight condition, and the flight control processing ends. That is, in this case, the drone 101 does not fly.

In step S152, in a case where the integrated battery remaining amount is equal to or less than the threshold TH1 or in a case where the remaining amount difference between the batteries 42 is equal to or greater than the threshold TH2, the battery management unit 31 determines that the battery remaining amount does not satisfy the flight condition, and the flight control processing ends. That is, in this case, the drone 101 does not fly.

In a case where it is determined in step S151 that at least some of the batteries 42 are not attached, the flight control processing ends. That is, in this case, the drone 101 does not fly.

As described above, the drone 101 can be caused to appropriately fly according to the state of the battery 42, and an accident or a dangerous situation can be avoided.

3. Modification Example

Hereinafter, a modification example of the above-described embodiment of the present technology will be described.

<Modification Example Regarding Notification Condition of Integrated Battery Remaining Amount>

For example, in a case where the number of attached batteries 42 changes, notification of the integrated battery remaining amount may be provided when the number of attached batteries 42 satisfies a predetermined condition, and notification of the integrated battery remaining amount may not be provided when the number of attached batteries 42 does not satisfy the predetermined condition.

Specifically, for example, in a case where the number of attached batteries 42 changes, notification of the integrated battery remaining amount may be provided when the number of attached batteries 42 is equal to or greater than a predetermined threshold, and notification of the integrated battery remaining amount may not be provided when the number of attached batteries 42 is less than the predetermined threshold. Note that, in the example of the drone 101 described above, this threshold value is set to have two values.

Note that in a case where the number of attached batteries 42 does not satisfy a predetermined condition, the integrated battery remaining amount may be processed as zero or unknown or the integrated battery remaining amount may be calculated by a calculation method similar to the case where the number of attached batteries 42 satisfies the predetermined condition.

For example, notification of the integrated battery remaining amount may be provided only when the battery 42 is attached or only when the battery 42 is detached.

<Modification Example Regarding Flight Condition>

In the above description, an example has been described in which whether or not the remaining amount difference between the batteries 42 is less than the threshold TH2 is used as one of the conditions for permitting the flight of the drone 101. On the other hand, for example, in a case where the maximum number of attached batteries 42 is three or more, the maximum value, the minimum value, or the average value of the remaining amount difference between the batteries 42 is used for comparison with the threshold TH2.

In the above description, an example has been described in which whether or not all the batteries 42 are attached is used as one of the conditions for permitting the flight of the drone 101. On the other hand, for example, in a case where the maximum number of attached batteries 42 is three or more, whether or not the number of attached batteries 42 is equal to or more than a predetermined number (for example, two) may be used as one of the conditions for permitting the flight of the drone 101.

Note that the same applies to the movement condition of the mobile body other than the drone 101.

<Modification Example Regarding Current Supply of Battery 42>

In the above description, an example has been described in which in a case where the voltage difference between the batteries 42 is equal to or greater than the threshold TH4, the current is supplied from the battery 42 having the larger voltage. On the other hand, in a case where the maximum number of attached batteries 42 is three or more, for example, a current may be supplied from the battery 42 having the maximum voltage, or a current may be supplied from one or more batteries 42 having a voltage equal to or higher than a predetermined threshold.

Other Modification Examples

For example, in a case where the number of attached batteries 42 changes, notification of the remaining amount of each battery 42 may be provided together with or instead of the integrated battery remaining amount.

For example, the battery management unit 31 of the mobile body 11 may actively detect the change in the attachment state of the battery 42 without depending on the notification from the battery unit 26.

For example, a transmitter may be provided between the mobile body 11 and the mobile device 12, and the mobile body 11 and the mobile device 12 may communicate with each other via the transmitter. In this case, the mobile body 11 and the transmitter perform wireless communication. The transmitter and the mobile device 12 may perform either wired communication or wireless communication.

In addition to the drone described above, the present technology can be applied to a mobile body that is driven by a battery, such as a vehicle, a two-wheeled vehicle, a ship, an airplane, a robot, or personal mobility, and allows a user to attach and detach the battery.

4. Others

<Configuration Example of Computer>

The above-described series of processing can be executed by hardware or software. In a case where the series of processing is executed by the software, a program constituting the software is installed in a computer. Here, examples of the computer include a computer incorporated in dedicated hardware, and a general-purpose personal computer capable of executing various functions by installing various programs.

Figure 11:
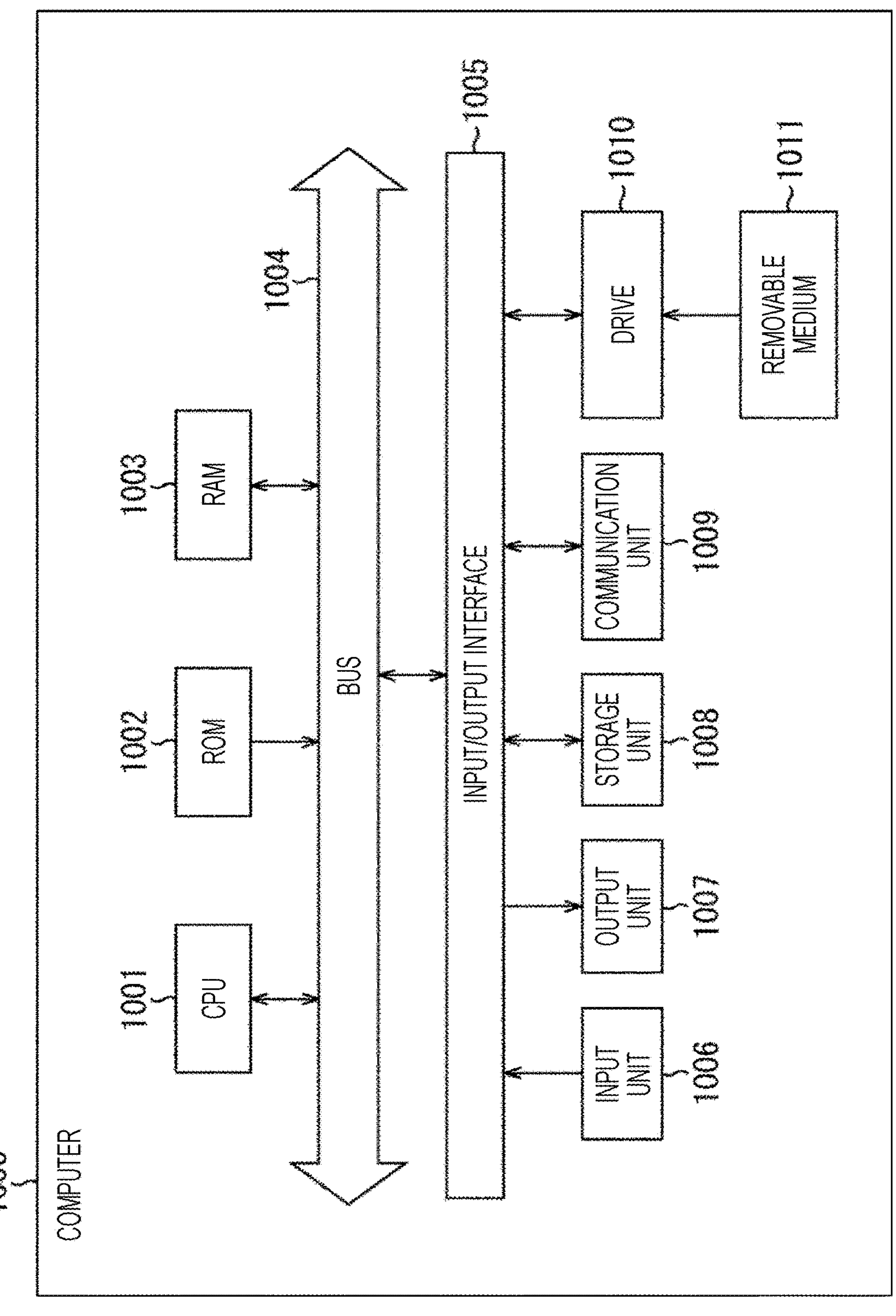
FIG. 11 is a block diagram illustrating a configuration example of a computer.

FIG. 11 is a block diagram illustrating a configuration example of the hardware of the computer that executes the above-described series of processing with a program.

In a computer 1000, a central processing unit (CPU) 1001, a read only memory (ROM) 1002, and a random access memory (RAN) 1003 are mutually connected by a bus 1004.

Moreover, an input/output interface 1005 is connected to the bus 1004. To the input/output interface 1005, an input unit 1006, an output unit 1007, a storage unit 1008, a communication unit 1009, and a drive 1010 are connected.

The input unit 1006 includes an input switch, a button, a microphone, and an imaging element. The output unit 1007 includes a display, and a speaker. The storage unit 1008 includes a hard disk, and a non-volatile memory. The communication unit 1009 includes a network interface. The drive 1010 drives a removable medium 1011 such as a magnetic disk, an optical disk, a magneto-optical disk, or a semiconductor memory.

In the computer 1000 configured as described above, the series of processing described above is performed, for example, by the CPU 1001 loading a program stored in the storage unit 1008 into the RAM 1003 via the input/output interface 1005 and the bus 1004, and executing the program.

The program executed by the computer 1000 (CPU 1001) can be provided, for example, by being recorded in the removable medium 1011 as a package medium or the like. Furthermore, the program can be provided via a wired or wireless transmission medium such as a local area network, the Internet, or digital satellite broadcasting.

In the computer 1000, by attaching the removable medium 1011 to the drive 1010, the program can be installed in the storage unit 1008 via the input/output interface 1005. Furthermore, the program can be received by the communication unit 1009 via a wired or wireless transmission medium, and installed in the storage unit 1008. In addition, the program can be installed in the ROM 1002 or the storage unit 1008 in advance.

Note that the program executed by the computer may be a program by which processing is performed in time series in the order described herein, or may be a program by which processing is performed in parallel or at necessary timing such as when a call is made or the like.

Furthermore, in the present description, a system means a set of a plurality of components (devices, modules (parts), and the like), and it does not matter whether or not all components are in the same housing. Therefore, both of a plurality of devices housed in separate housings and connected via a network and a single device in which a plurality of modules is housed in one housing are systems.

Moreover, the embodiment of the present technology is not limited to the above-described embodiment, and various modifications can be made without departing from the gist of the present technology.

For example, the present technology may be configured as cloud computing in which one function is shared by a plurality of devices through the network to process together.

Furthermore, each step described in the above-described flowchart can be executed by one device or executed by a plurality of devices in a shared manner.

Moreover, in a case where a plurality of processing is included in one step, the plurality of processing included in one step can be executed by one device or by a plurality of devices in a shared manner.

<Combination Example of Configurations>

The present technology can also have the following configurations.

(1)

A mobile body including:

an attachment portion to which two or more n batteries are capable of being attached; and an output unit configured to provide notification of a remaining amount of each of the batteries in a case where the number of attached batteries changes.

(2)

The mobile body according to (1), in which in a case where the number of attached batteries changes, the output unit provides notification of the remaining amount of the battery when the number of attached batteries satisfies a predetermined condition, and the output unit does not provide notification of the remaining amount of the battery when the number of attached batteries does not satisfy the predetermined condition.

(3)

The mobile body according to (2), in which in a case where the number of attached batteries changes, the output unit provides notification of the remaining amount of the battery when the number of attached batteries is n, and the output unit does not provide notification of the remaining amount of the battery when the number of attached batteries is less than n.

(4)

The mobile body according to any one of (1) to (3), in which in a case where a power is turned off, the output unit provides notification of the remaining amount of the battery when the number of attached batteries changes.

(5)

The mobile body according to (4), in which in a case where the power is turned on, the output unit provides notification of the remaining amount of the battery regardless of presence or absence of a change in the number of attached batteries.

(6)

The mobile body according to any one of (1) to (5), in which after the number of attached batteries changes, the output unit provides notification of the remaining amount of the battery for a predetermined period of time.

(7)

The mobile body according to any one of (1) to (6), further including:

a battery management unit configured to detect the remaining amount of the battery attached to the attachment portion.

(8)

The mobile body according to (7), in which the battery management unit calculates a maximum value, a minimum value, or an average value of the remaining amount of the battery attached to the attachment portion, and the output unit provides notification of the remaining amount of the battery on the basis of a calculation result of the maximum value, the minimum value, or the average value of the remaining amount of the battery.

(9)

The mobile body according to (7) or (8), further including:

a drive unit configured to move the mobile body by using electric power of the battery; and an operation control unit configured to control the drive unit, in which the operation control unit does not move the mobile body in a case where a remaining amount difference between the batteries is equal to or greater than a predetermined threshold.

(10)

The mobile body according to (9), in which the battery management unit causes a current to be supplied from the battery having a maximum voltage to the drive unit in a case where a voltage difference between the batteries is equal to or greater than a predetermined threshold, and the battery management unit causes the current to be supplied from each battery to the drive unit in a case where the voltage difference between the batteries is less than the predetermined threshold value.

(11)

The mobile body according to any one of (1) to (8), further including:

a drive unit configured to move the mobile body by using electric power of the battery.

(12)

The mobile body according to any one of (1) to (11), in which the mobile body is a drone.

(13)

A battery remaining amount notification method including:

causing a mobile body to which two or more n batteries are capable of being attached to provide notification of a remaining amount of each of the batteries in a case where the number of attached batteries changes.

Note that the effects described in the present description are merely examples and are not limited, and other effects may be provided.

REFERENCE SIGNS LIST

11 Mobile body
12 Mobile device
21 Control unit
23 Drive unit
24 Output unit
26 Battery unit
31 Battery management unit
32 Operation control unit
33 UI control unit
41-1 to **41-*n*** Battery slot
42-1 to **42-*n*** Battery
101 Drone
112 Battery remaining amount LED
113-1 to 113-4 Flight status LED

The invention claimed is:

1. A mobile body comprising: an attachment portion to which two or more batteries are capable of being attached; an output unit including at least one of a display and a speaker configured to provide notification of a remaining amount of each of the two or more batteries and an integrated battery remaining amount of the two or more batteries together in a case where a number of attached batteries changes; a battery management computer configured to detect the remaining amount of each of the two or more batteries and the integrated battery remaining amount of the two or more batteries attached to the attachment portion; a motor configured to move the mobile body by using electric power of the two or more batteries; and an operation control computer configured to control the motor, wherein the operation control computer does not move the mobile body in a case where a remaining amount difference between the two or more batteries is equal to or greater than a predetermined threshold, and wherein the operation control computer does move the mobile body in a case where the remaining amount difference between the two or more batteries is less than the predetermined threshold.

2. The mobile body according to claim 1, wherein in a case where the number of attached batteries changes, the output unit provides notification of the remaining amount of each of the two or more batteries and the integrated battery remaining amount of the two or more batteries when the number of attached batteries satisfies a predetermined condition, and the output unit does not provide notification of the remaining amount of each of the two or more batteries and the integrated battery remaining amount of the two or more batteries when the number of attached batteries does not satisfy the predetermined condition.

3. The mobile body according to claim 2, wherein:

a number of batteries capable of being attached is n, and in a case where the number of attached batteries changes, the output unit provides notification of the remaining amount of each of the two or more batteries and the integrated battery remaining amount of the two or more batteries when the number of attached batteries is n, and the output unit does not provide notification of the remaining amount of each of the two or more batteries and the integrated battery remaining amount of the two or more batteries when the number of attached batteries is less than n.

4. The mobile body according to claim 1, wherein in a case where a power is turned off, the output unit provides notification of the remaining amount of each of the two or more batteries and the integrated battery remaining amount of the two or more batteries when the number of attached batteries changes.

5. The mobile body according to claim 4, wherein in a case where the power is turned on, the output unit provides notification of the remaining amount of each of the two or more batteries and an integrated battery remaining amount of the two or more batteries regardless of presence or absence of a change in the number of attached batteries.

6. The mobile body according to claim 1,
wherein after the number of attached batteries changes, the output unit provides notification of the remaining amount of each of the two or more batteries and an integrated battery remaining amount of the two or more batteries for a predetermined period of time.

7. The mobile body according to claim 1,
wherein the battery management computer is further configured to calculate a maximum value, a minimum value, or an average value of the remaining amount of each of the two or more batteries and the integrated battery remaining amount of the two or more batteries attached to the attachment portion, and
the output unit is further configured to provide notification of the remaining amount of each of the two or more batteries and the integrated battery remaining amount of the two or more batteries on a basis of a calculation result of the maximum value, the minimum value, or the average value of the remaining amount of each of the two or more batteries and the integrated battery remaining amount of the two or more batteries.

8. The mobile body according to claim 1,
wherein the battery management computer is configured to cause a current to be supplied from the two or more batteries having a maximum voltage to the motor in a case where a voltage difference between the two or more batteries is equal to or greater than a predetermined threshold value, and the battery management computer causes the current to be supplied from each battery to the motor in a case where the voltage difference between the two or more batteries is less than the predetermined threshold value.

9. The mobile body according to claim 1, further comprising
a motor configured to move the mobile body by using electric power of the battery.

10. The mobile body according to claim 1,
wherein the mobile body is a drone.

11. A battery remaining amount notification method comprising
causing the mobile body according to claim 1, to which the two or more batteries are capable of being attached to provide notification of the remaining amount of each of the two or more batteries and the integrated battery remaining amount of the two or more batteries together in the case where the number of attached batteries changes.

12. The mobile body according to claim 6, wherein the predetermined period of time is 10 seconds.

13. The mobile body according to claim 10, wherein the drone cannot start a flight unless a battery is connected to each attachment portion.

* * * * *